US006261725B1

United States Patent
Tzu et al.

(10) Patent No.: US 6,261,725 B1
(45) Date of Patent: Jul. 17, 2001

(54) PHASE ANGLE MODULATION OF PSM BY CHEMICAL TREATMENT METHOD

(75) Inventors: San-De Tzu; Wei-Zen Chou, both of Taipei; Ching-Shiun Chiu, Kaohsiung, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/428,572

(22) Filed: Oct. 28, 1999

(51) Int. Cl.[7] ................................................. G03F 9/00
(52) U.S. Cl. ........................................................... 430/5
(58) Field of Search .......................... 430/5, 322; 378/34, 378/35

(56) References Cited

U.S. PATENT DOCUMENTS

| 5,700,605 | * 12/1997 | Ito et al. | 430/5 |
| 5,702,847 | 12/1997 | Tarumoto et al. | 430/5 |
| 5,723,234 | 3/1998 | Yokogama et al. | 430/5 |
| 5,789,116 | * 8/1998 | Kim | 430/5 |
| 5,804,337 | 9/1998 | Mitsui | 430/5 |
| 5,851,705 | 12/1998 | Lee | 430/5 |

* cited by examiner

Primary Examiner—S. Rosasco
(74) Attorney, Agent, or Firm—George O. Saile; Stephen B. Ackerman; Alek P. Szecsy

(57) ABSTRACT

A method for modulating the phase angle of a phase shift mask employed in deep ultraviolet (DUV) photolithography. There is provided a quartz substrate within which may be formed an engraved pattern, and upon which is formed a patterned phase shift layer. The phase angle of the phase shift layer upon the quartz substrate may be incrementally increased or decreased by subtractive etching of the phase shift layer and quartz substrate of the phase shift mask in an alkaline solution at a selected temperature and concentration for a period of time.

15 Claims, 3 Drawing Sheets

PHASE ANGLE MODULATION OF PSM BY CHEMICAL TREATMENT METHOD

BACKGROUND OF THE INVENTION

1. Field of the Invention

The invention relates to the field of photolithographic fabrication processes for microelectronics fabrication. More particularly the invention relates to photomasks employed in photolithographic pattern generation for microelectronics fabrication.

2. Description of the Related Art

Microelectronics fabrications are constructed of multiple layers of microelectrornics materials formed in laminar fashion sequentially on a substrate or carrier. Many of the microelectronics layers are patterned, and the patterns must be matched or registered to each other with extreme precision and accuracy. A common method for forming a patterned microelectronics layer employs a patterned etch mask layer formed over the microelectronics layer followed by subtractive etching of the microelectronics layer. Alternatively, the patterned mask layer may be used to form a second microelectronics layer over the first by an additive process.

A patterned etch mask layer usually consists of an organic polymer light sensitive layer known as a photoresist layer which has been exposed to the chosen pattern through a corresponding exposure mask and the resulting latent pattern subsequently developed. The light shining through the transparent portions of the exposure mask causes a chemical change in the photoresist layer material thus exposed compared to the portions which were not exposed due to the opacity of the exposure pattern, and hence appropriate chemical treatment differentiates between exposed and unexposed portions of the photoresist, allowing the exposure pattern to be replicated in the photoresist layer. The photoresist pattern may be a direct copy of the exposure pattern if the photoresist is a positive-working resist, or the photoresist pattern may be a reversed or negative copy of the exposure pattern if the photoresist is a negative-working photoresist.

The exposure of the photoresist may be accomplished directly from a contact or close proximity alignment of the exposure pattern (contact mask), followed by illumination with a collimated source of light, or by projection of the optically reduced image of the exposure pattern (reticle) on to the surface of the photoresist layer. In either case, the boundary between a clear region transmitting light and an opaque region blocking light in the original image of the pattern is ideally as sharp as possible. In practice, the sharpness of the transition from clarity to opacity is limited by several factors. The ultimate limit is set by diffraction of the exposing light at the boundary edge, which is greater for longer wavelengths. For this reason the exposure conditions have proceeded to ever shorter wavelength radiation, so that currently there is wide use of deep ultraviolet (DUV) radiation for photoexposure of patterns.

Other limits are set by available materials and methods employed. For masking off illumination, it is necessary to use highly opaque materials such as chromium in the form of extremely thin film layers on optically clear substrates of high transmittance, such as optical grade quartz. Light scattering at the edge of even the sharpest image boundary may lead to a less than abrupt edge in the corresponding photoresist pattern. To minimize this effect, a phase shift photomask pattern may be employed. In this type of photomask, there is formed an image pattern which combines opacity and transmittance properties of a material formed into a patterned phase shift layer on a substrate material. The phase shift material is translucent to the exposing radiation of wavelength L and possesses a refractive index $n_t$ such that if, after being formed as a layer of thickness x, there is satisfied the relationship:

$$X = \frac{180°}{360°}\left[\frac{L}{n_1 - 1}\right]$$

then there is a destructive interference of the light being transmitted by the clear region and the light partially transmitted adjacently by the translucent image phase shift layer. This effect pertains whenever the thickness difference between the substrate surface and the phase shift layer is a half-integral multiple of L.

Phase shift photomasks for use with deep ultraviolet (DUV) exposure radiation are generally formed employing quartz substrates with high DUV transmittance for the clear areas and a phase shift DUV absorbing patterned layer formed of an etchable translucent material such as spin-on-glass (SOG) dielectric material, for example. This combination is known as a single half-tone phase shift mask, and has the advantage of both clear and absorbing areas being transparent to visible light which is usefull for inspection purposes An optional thin partially absorbing layer such as chromium may be employed in a coincident pattern fashion with the phase shift layer, in which case the mask is a multiple layer half tone phase shift mask. In many cases a pattern is engraved in the quartz layer adjacent to the patterned phase shift layer so that the thickness of the phase shift layer and the depth of the adjacent quartz engraved pattern are equal to the appropriate half-integral multiple of the wavelength L to embody the destructive phase shift.

Although various forms of phase shift mask are satisfactorily employed for DUV exposure in microelectronics fabrication, such phase shift masks are not without problems. For example, the control of the phase shift is critical, and phase shift masks which are only a few degrees away from the ideal phase shift of 180° may be unsuitable for use and rejected on inspection. Furthermore, the degree to which transmittance and phase shift can be manipulated to attain optimum mask performance may require incompatible methods of modulating either of these properties for a given mask material set. Generally a change in phase angle caused by etching to decrease thickness can cause a thickness change and hence a phase angle change incrementally in one direction only, i. e. in whatever direction a subtractive change provides.

It is thus towards the goal of providing methods for incremental modification of the phase angle of a phase shift mask to attain the specified values for both phase angle and transmittance that the present invention is generally and specifically directed.

Various methods have been disclosed for forming and modifying phase shift masks employed in microelectronics fabrication.

For instance, Tarumoto et al., in U.S. Pat. No. 5,702,847, disclose a method for forming a phase shift mask with little or no distortion or defects from the peripheral region. The method employs a spin-on-glass (SOG) dielectric material as the phase shift layer, and selectively removes by a lift-off method the thicker resion of the SOG which tends to form at the periphery during spin application.

Further, Yokoyama et al., in U.S. Pat. No. 5,723,234, disclose a method for dry etching a phase shift photomask to produce a uniform pattern dimension even where there is a large difference in exposed area ratio for different portions of the mask The method provides a dummy pattern in an unused portion of the mask area for dry etch correction of the image pattern.

Still further, Mlitsui, in U.S. Pat. No. 5,804,337, discloses a method for producing a phase shift mask with excellent contrast at the boundary of the pattern. The method provides a translucent phase shift layer deposited on a blank transmitting substrate employing sputtering of a mixture of a metal, silicon, oxygen and nitrogen.

Finally, Lee, in U.S. Pat. No. 5,851,705, discloses a method for forming a self-aligned phase shift mask. The method employs light-shielding patterns formed on a substrate over which a photoresist layer is formed. Infusing the photosensitive material with an organic material with an alkaline component is followed by back exposure and development to produce an overhanging structure which acts as a mask for selective etching of the phase shift pattern into the substrate.

Desirable in the art of microelectronics fabrication are further methods for fabricating a phase shift photomask with the capability of modulation of phase angle without affecting transmittance.

It is towards this goal that the present invention is generally directed.

SUMMARY OF THE INVENTION

It is a first object of the present invention to provide a method for simultaneous modulation of the phase angle and transmittance of a phase shift mask.

It is a second object of the present invention to provide a method in accord with the first object of the present invention where the modulation of the phase angle of a deep ultraviolet (DUV) phase shift mask is accomplished incrementally by etching of the phase shift layer and engraved quartz substrate without significant degradation of the transmittance of the engraved quartz substrate.

It is a third object of the present invention to provide a method in accord with the first object of the present invention and/or the second object of the present invention where the phase angle modulation may be selectively increased or decreased incrementally with respect to 180° as desired without significant change of transmittance.

It is a fourth object of the present invention to provide a method in accord with the first object of the present invention, the second object of the present invention and the third object of the present invention where the method is readily commercially implemented.

In accord with the objects of the present invention, there is provided a method for simultaneously modulating the phase angle and transmittance of a deep ultraviolet (DUV) phase shift mask without significant degradation of the transmittance of the quartz substrate. To practice the invention, there is first provided a phase shift mask comprising a patterned phase shift layer formed over an adjacent pattern engraved within a quartz substrate. There is then determined the degree of departure from the desired phase angle. There is then subtractively etched the phase shift layer and the engraved quartz substrate of the DUV mask in a chemical solution wherein the normality, temperature and etch time are chosen to bring about the desired incremental increase or decrease in phase angle with insignificant change in transmittance of the engraved quartz substrate.

The present invention provides a method for adjusting the phase angle of a phase shift mask employing subtractive etching of the phase shift layer and engraved quartz substrate while simultaneously leaving the transmittance essentially unchanged. The method employs a chemical solution at a particular concentration and temperature as the subtractive etching agent to alter the thickness and hence phase angle of the phase shift layer and depth of the engraved quartz substrate without significant effect on the transmittance of the quartz layer.

The present invention employs methods and materials as are known in the art of microelectronics fabrication, but in a novel arrangement and sequence. The method of the present invention is therefore readily commercially implemented.

BRIEF DESCRIPTION OF THE DRAWINGS

The objects, features and advantages of the present invention are understood within the context of the Description of the Preferred Embodiment as set forth below. The Description of the Preferred Embodiment is understood within the context of the accompanying drawings, which form a material part of this disclosure, wherein.

DESCRIPTION OF THE PREFERRED EMBODIMENT

The present invention provides a method for subtractive etching of a phase shift layer formed upon a deep ultraviolet (DUV) phase shift mask to modulate the phase angle incrementally without significantly altering the transmittance of the phase shift mask.

Figure 4:
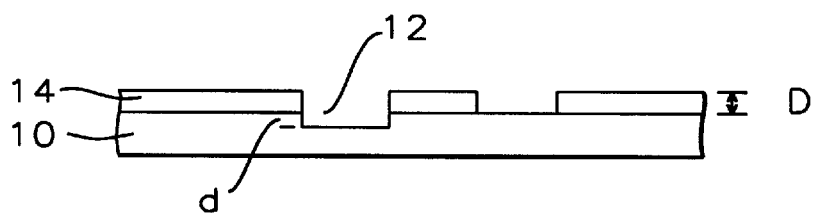
FIG. 4 and FIG. 5 are a pair of schematic cross-sectional diagrams illustrating the state of a deep ultraviolet (DUV) phase shift mask before and after incrementally modifying the phase angle of the phase shift layer by an amount increasing towards 180° in accord with a general embodiment of the present invention.
Figure 5:
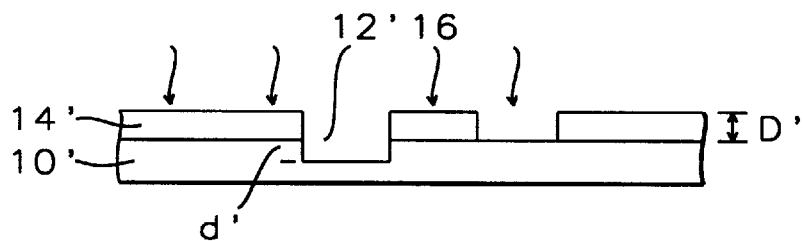

FIG. 4 and FIG. 5 are schematic crossectional diagrams illustrating the operation of the present invention to modulate the phase angle shift from an initial state (FIG. 4) wherein the phase angle is below the specification to a final state (FIG. 5) wherein the phase angle has been modulated incrementally by subtractive etching to increase to the desired amount without significantly affecting the transmittance of the phase shift mask, in accord with a general embodiment of the present invention.

Referring now more particularly to FIG. 4, there is shown a schematic cross-sectional diagram of a deep ultraviolet (DUV) phase shift mask prior to application of the method of the present invention. Shown in FIG. 4 is a quartz substrate 10 in which a pattern 12 has been engraved. Formed upon the engraved quartz substrate is a phase shift layer 14 formed into a pattern 16 of depth d. The thickness of the phase shift layer is D, and the total thickness difference D+d for complete destructive interference is related to the wavelength L of the exposing radiation by:

$$D+d=L/2[(n)/N_i-1]$$

where $N_i$ is the refractive index of the phase shift layer at the exposure wavelength of L, if L is assumed to be monochromatic.

With respect to the quartz substrate 10 shown in FIG. 4, the quartz substrate 10 is optically transparent to light of wavelength L. With respect to the pattern 12 engraved into the quartz substrate 10 shown in FIG. 4, the pattern 12 is formed by methods which are known in the art of mask fabrication. Preferably the pattern 12 is formed employing dry subtractive etching methods for precise control of the depth d of the engraved pattern.

With respect to the phase shift layer 14 shown in FIG. 4, the phase shift layer 14 is formed of a material which is translucent to the exposure radiation of wavelength so that insufficient intensity of radiation is transmitted to expose the photoresist material. Preferably the phase shift layer 14 is a silicon containing dielectric layer such as silicon dioxide (silica) formed employing an aqueous silicate suspension in equilibrium to deposit the layer:

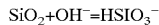

Preferably the thickness of the phase shift layer after formation is adjusted to the precise desired thickness by gas phase subtractive etching method as is known in the art of microelectronics fabrication.

Referring now more particularly to FIG. 5, there is shown a schematic cross-sectional diagram illustrating the result of applying the method of the present invention to the DUV phase shift mask whose schematic cross-sectional diagram is shown in FIG. 4. Shown in FIG. 5 is a DUV phase shift mask otherwise equivalent to the phase shift mask shown in FIG. 4, but where there has been subtractively etched the quartz engraved pattern 12' and the phase shift layer 14' by the etching solution 16 to form an engraved pattern depth d' and a phase shift layer of thickness D', the resulting combination causing the resulting phase angle to increase by the desired amount to approach 180° without significantly affecting transmittance.

With respect to the chemical etching solution 16 shown in FIG. 5, the chemical etching solution 16 is formulated to provide a known amount of phase angle change per unit time of exposure at a given temperature. Preferably, the etching solution 16 is an alkaline solution chosen to etch the silicon containing dielectric material employed as the phase shift layer. In order to cause the combined etching operations to result in an increase in phase angle, the temperature of the etching solution is preferably about 70 degrees centigrade.

Figure 6:
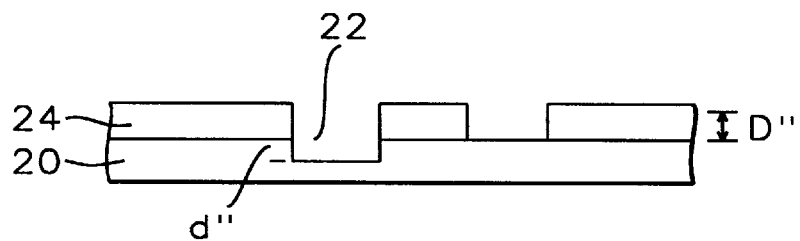
FIG. 6 and FIG. 7 are a pair of schematic cross-sectional diagrams illustrating the state of a deep ultraviolet (DUV) phase shift mask before and after incrementally modifying the phase angle of the phase shift layer by an amount decreasing towards 180° in accord with the general embodiment of the present invention.
Figure 7:
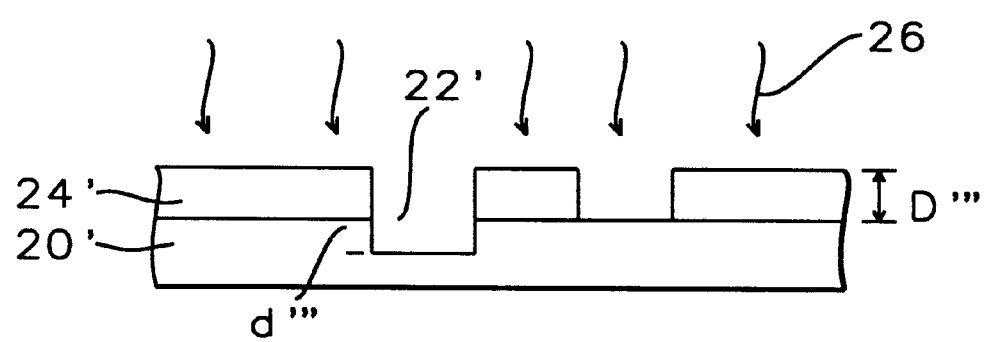

Referring now more particularly to FIG. 6 and FIG. 7, there is shown a pair of schematic cross-sectional diagrams illustrating the operation of the present invention to modulate the phase angle of a phase shift mask from an initial state (FIG. 6) wherein the phase angle is above the specification to a final state (FIG. 7) wherein the phase angle has been incrementally modulated by subtractive etching of the phase shift layer and the quartz substrate by the desired decreasing amount to approach 180° C.

Referring now to FIG. 6, there is shown a schematic cross-sectional diagram of a deep ultraviolet (DUV) phase shift mask equivalent to the DUV phase shift mask whose schematic cross-sectional diagram is shown in FIG. 4. Shown in FIG. 6 is a quartz substrate 20, within which is formed an engraved pattern 22 to a depth d" and an adjacently formed patterned phase shift layer 24 of thickness D".

With respect to the quartz substrate 20, the engraved pattern 22 and the phase shift layer 24 shown in FIG. 6, they are equivalent respectively to the quartz substrate 10, the engraved pattern 12 and the phase shift layer 14 shown in FIG. 4.

Referring now more particularly to FIG. 7, there is shown a schematic cross-sectional diagram illustrating the result of applying the method of the present invention to the DUV phase shift mask whose schematic cross-sectional diagram is shown in FIG. 6. Shown in FIG. 7 is a DUV phase shift mask otherwise equivalent to the DUV phase shift mask shown in FIG. 6, but where there has been subtractively etched the phase shift layer 24' and the quartz substrate engraved pattern 22' by the etching solution 26 to form an engraved pattern of depth d''' and a phase shift layer 24' of thickness D''', the resulting combination causing the phase angle to decrease by the desired amount to approach 180° without significantly affecting transmittance of the quartz substrate.

With respect to the etching solution 26 shown in FIG. 7, the etching solution 26 is analogous to the etching solution 16 shown in FIG. 5. Preferably the etching solution is employed at a temperature of about 20 degrees centigrade to produce combined etch rates of the phase shift layer and engraved pattern of the quartz substrate which result in incrementally decreasing the phase angle towards 180° C.

EXAMPLES

Figure 1:
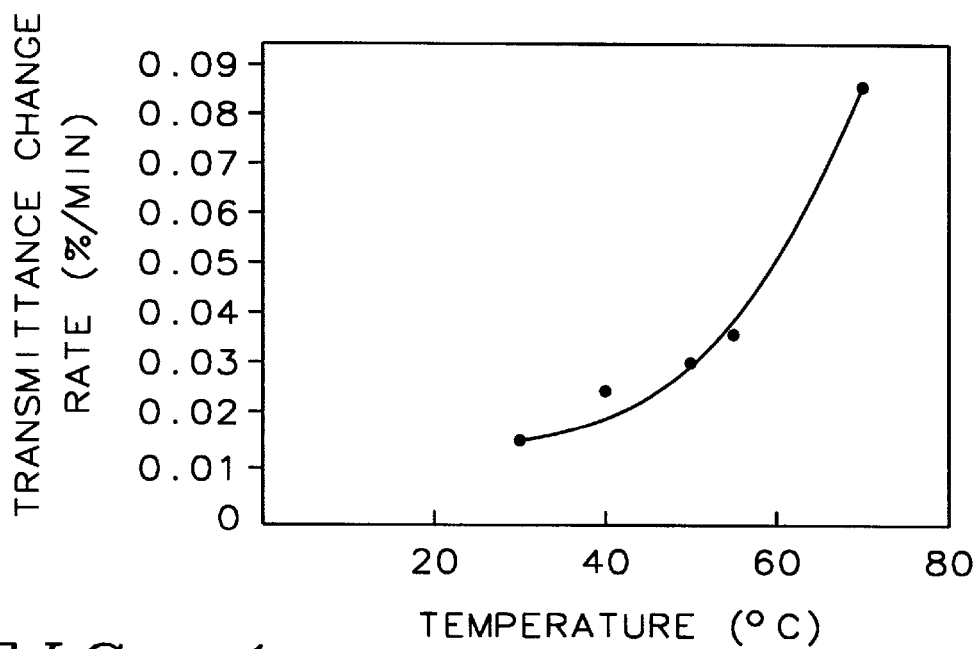
FIG. 1 is a graph of the chance rate of the phase angle of a DUV phase shift mask with respect to etching temperature for a given etchant concentration.
Figure 2:
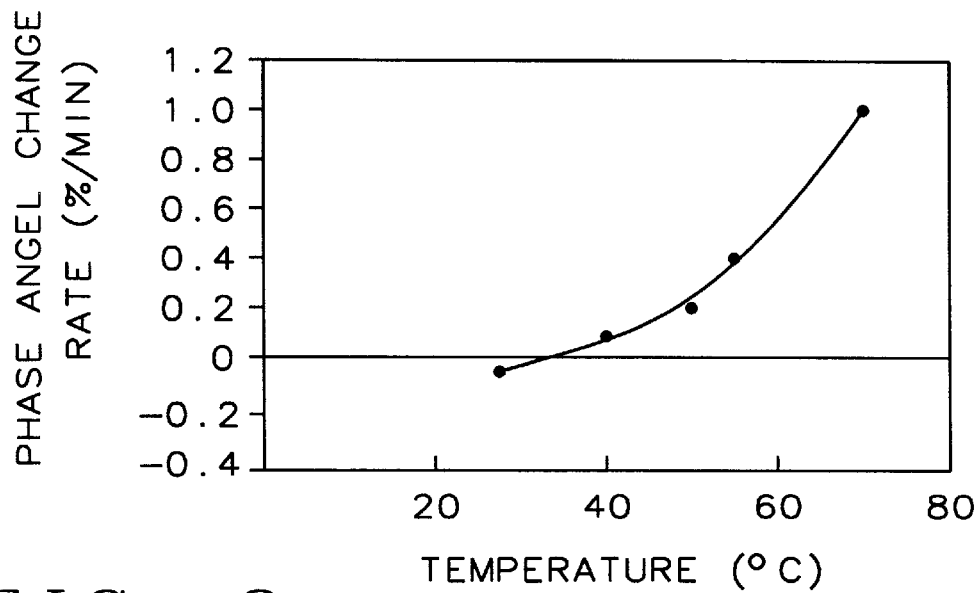
FIG. 2 is a graph of the change rate of transmittance of a DUV phase shift mask with respect to temperature for a given etchant concentration.
Figure 3:
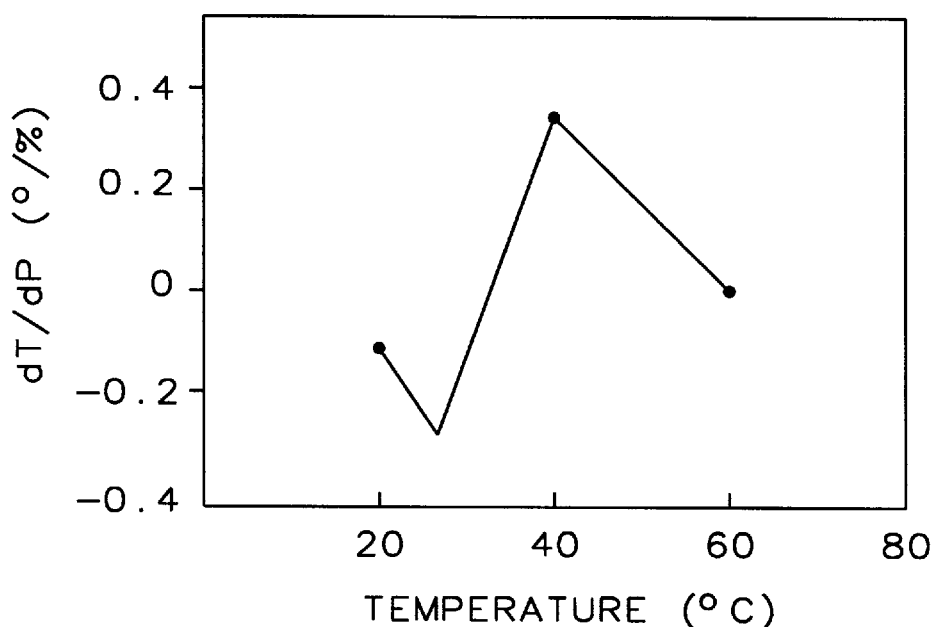
FIG. 3 is a graph of the rate of change of phase angle with respect to percent transmittance versus etching temperature for a DUV phase change mask.

Referring now to FIG. 1, FIG. 2 and FIG. 3, there are shown a series of graphs illustrating the rates of change of phase angle, transmittance, and the corresponding rate of change of transmittance with phase angle versus temperature over the range of 20 to 80 degrees centigrade for a phase shift layer formed of molybdenum silicon oxynitride ($MoSiO_xN_y$). It is seen from the data in FIG. 1 to FIG. 3 that a specific operating point of temperature can be selected to modulate the phase shift of a given layer in either direction near 180° by selecting the appropriate temperature and time of etching. For example, to increase the phase angle slightly from less than 180° C., etching the phase shift mask at a temperature of about 70 degrees for a period of time will bring about the desired incremental increase in phase angle. Correspondingly, to decrease the phase angle incrementally from slightly above 180° C., etching at a temperature of about 20 degrees centigrade for a period of time will bring about the desired incremental decrease in phase angle.

The data of FIG. 1 to FIG. 3 are specifically for a solution of sodium hydroxide at a normality of 5.6 mole/liter, but increasing or decreasing the concentration merely changes the rate of etching accordingly, and may be employed if so desired with appropriate calibration of rates. Concentrations as high as 11.2 moles/liter of sodium hydroxide may be employed. Other alkaline etching agents may also be employed with correspondingly different relative rates of etching and changes of phase angle and transmittance.

As is understood by a person skilled in the art, the preferred embodiment of the present invention is illustrative of the present invention rather than limiting of the present invention. Revisions and modifications may be made to materials, structures and dimensions through which is provided the preferred embodiment of the present invention while still providing embodiments which are within the spirit and scope of the present invention, as defined by the appended claims.

What is claimed is:

1. A method for modulating the phase angle of a phase shift mask comprising:
   providing a phase shift mask with an etchable patterned phase shift layer formed upon and adjacent to a pattern engraved within a quartz substrate;

determining the degree of deviation from 180° of the phase angle; and etching the phase shift layer and engraved quartz substrate under conditions wherein the said combined etch rates are sufficient to cause the desired thickness change in said phase shift layer and depth change in said engraved quartz substrate pattern to bring about the corresponding desired phase angle change.

2. The method of claim 1 wherein the phase shift mask is a deep ultraviolet (DUV) exposure radiation phase shift mask formed on a quartz substrate.

3. The method of claim 1 wherein the etching of the DUV phase shift mask employs chemical etching which does not significantly affect the transmittance of the phase shift mask.

4. The method of claim 2 wherein the DUV phase shif mask comprises:

a quartz substrate patterned by engraving; and a translucent patterned phase shift layer adjacent to said engraved pattern.

5. The method of claim 4 wherein the translucent phase shift layer is formed of a silicon containing dielectric material such as silicon dioxide (silica).

6. The method of claim 1 wherein the chemical etching agent is an alkaline etching solution.

7. The method of claim 6 wherein the alkaline etching solution is a sodium hydroxide solution whose normality is selected to permit appropriate values of combined etch rates of the engraved quartz substrate pattern and phase shift layer to be obtained by selecting the temperature of the etching solution.

8. The method of claim 7 wherein the normality of the sodium hydroxide etching solution varies from about 5.6 to about 11.2 moles/liter.

9. The method of claim 6 wherein the temperature range of the sodium hydroxide etching solution varies from about 20 degrees centigrade to about 80 degrees centigrade.

10. A method for modulating the phase angle of a deep ultraviolet (DUV) phase shift mask from less than 180° to about 180° comprising:

providing a DUV phase shift mask having a phase shift layer formed upon an engraved quartz substrate;

determining the phase angle to be less than 180° C ; and chemically etching the phase sift layer and engraved quartz substrate pattern of the mask in an alkaline solution at about 70 degrees centigrade for a predetermined period of time.

11. The method of claim 10 wherein the phase shift layer is formed employing a silicon containing dielectric material.

12. The method of claim 10 wherein the phase angle shift obtained by simultaneous etching of the phase shift layer and the engraved quartz substrate pattern does not significantly affect the transmittance of the quartz substrate.

13. A method for modulating the phase angle of a phase shift mask from greater than 180° to about 180° comprising:

providing a phase shift mask having a phase shift layer formed upon an engraved quartz substrate;

determining the phase angle to be greater than 180°;

chemically etching the phase shift layer and the engraved quartz substrate pattern of the phase shift mask in an alkaline etching solution at a temperature of about 20 degrees centigrade for a pre-determined period of time.

14. The method of claim 13 wherein the phase shift layer is formed employing a silicon containing dielectric material.

15. The method of claim 13 wherein the simultaneous chemical etching of the phase shift layer and the engraved quartz substrate pattern does not significantly affect the transmittance of the quartz substrate.

* * * * *